(12) United States Patent
Lewis et al.

(10) Patent No.: US 11,994,957 B1
(45) Date of Patent: May 28, 2024

(54) ADAPTIVE COMPRESSION TO IMPROVE READS ON A DEDUPLICATION FILE SYSTEM

(71) Applicant: Dell Products L.P., Round Rock, TX (US)

(72) Inventors: Donna Barry Lewis, Holly Springs, NC (US); Nitin Madan, Cupertino, CA (US); Bhimsen Bhanjois, Fremont, CA (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 18/194,006

(22) Filed: Mar. 31, 2023

(51) Int. Cl.
| | | |
|---|---|---|
| *G06F 16/00* | (2019.01) | |
| *G06F 11/14* | (2006.01) | |
| *G06F 11/34* | (2006.01) | |
| *G06F 16/174* | (2019.01) | |
| *H03M 7/30* | (2006.01) | |

(52) U.S. Cl.
CPC ...... *G06F 11/1469* (2013.01); *G06F 11/1453* (2013.01); *G06F 11/3423* (2013.01); *G06F 16/1748* (2019.01); *H03M 7/3091* (2013.01)

(58) Field of Classification Search
CPC .................................................. G06F 16/1748
See application file for complete search history.

(56) References Cited

U.S. PATENT DOCUMENTS

2021/0258267 A1*   8/2021   Vishwakarma ....... H04L 47/225

\* cited by examiner

*Primary Examiner* — Ajith Jacob
(74) *Attorney, Agent, or Firm* — Staniford Tomita LLP

(57) ABSTRACT

Improving the performance of read operations in a restore path of an inline deduplication system utilizing a DDBOOST interface by providing an adaptive compression component for use with DDBOOST applications. The system utilizes a built-in compression mode for transferring read data if there is a sufficient available CPU resources in both the server and client to respectively compress and decompress the read data without destabilizing the system. CPU usage on both the client and the server is tracked to generate predicted respective CPU usage. These respective predictions are compared to defined maximum threshold usage values. If the predicted values do not exceed the thresholds, compression is used, otherwise the data is transmitted over the network as non-compressed data.

20 Claims, 8 Drawing Sheets

ADAPTIVE COMPRESSION TO IMPROVE READS ON A DEDUPLICATION FILE SYSTEM

TECHNICAL FIELD

Embodiments relate generally to deduplication storage systems, and specifically to using adaptive compression to improve read operations on a deduplication file system.

BACKGROUND OF THE INVENTION

Data is typically backed up by copying the data from a data source (backup client) to a storage device through a backup server. Data deduplication is a form of single-instance storage that eliminates redundant copies of data to reduce storage requirements. Data compression methods are used to store only one unique instance of data by replacing redundant data blocks with pointers to the unique data copy. As new data is written to a system, duplicate chunks are replaced with these pointer references to previously stored data. The Data Domain File System (DDFS) is an example of an inline data deduplication filesystem. As data gets written to the filesystem, DDFS breaks it into variable sized segments and a group of segments are packed in a compression region, and a fingerprint signature (hash value) is calculated for segments of compression regions and serves as a pointer reference to the original data.

Overall backup/restore operations typically include backup operations that write data to the storage media and restore operations that read data from the storage media. For many deduplication file systems, write operations are usually optimized because certain I/O filtering is used to reduces the number of I/O operations on the storage media. Because of this, write I/Os are usually a small fraction of the total number of I/Os for the backup operation. Read operations for the restore path, however, are not filtered in this manner, thus making them a source of weakness with respect to system performance. For reads, every byte from the storage network must be individually read and transferred over the network. Thus, another potential problem area for such read operations is overutilization of any available networking bandwidth.

To overcome the I/O and bandwidth burden of such read operations, some file systems provide a compression scheme to reduce the amount of data read and transferred through the restore path. Compression, however, is typically a very processor-intensive task. This not only imposes a processing burden on the backup system, but can also produce certain unintended consequences, and in severe cases, even bring down the backup server. Present compression systems are usually limited to either on or off modes of operation, such that they are either used for full compression during restores, or not used at all, i.e., the data is read and transmitted as cleartext from the storage device. In cases where processor (i.e., CPU) resources are effectively unbounded, such a scheme may be acceptable, however, in most practical systems with limited CPU bandwidth, present compression for data restores poses a large risk of system degradation and even failure.

What is needed, therefore, is a method and system for enabling compression mechanisms for data restores to work in a way that does not overly impact CPU resources, such as by enabling adaptive compression based on system resources and data characteristics.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions. EMC, Data Domain, Data Domain Restorer, Data Domain Boost, and DDBOOST are trademarks of Dell EMC Corporation.

BRIEF DESCRIPTION OF THE DRAWINGS

In the following drawings, like reference numerals designate like structural elements. Although the figures depict various examples, the one or more embodiments and implementations described herein are not limited to the examples depicted in the figures.

DETAILED DESCRIPTION

Figure 1:
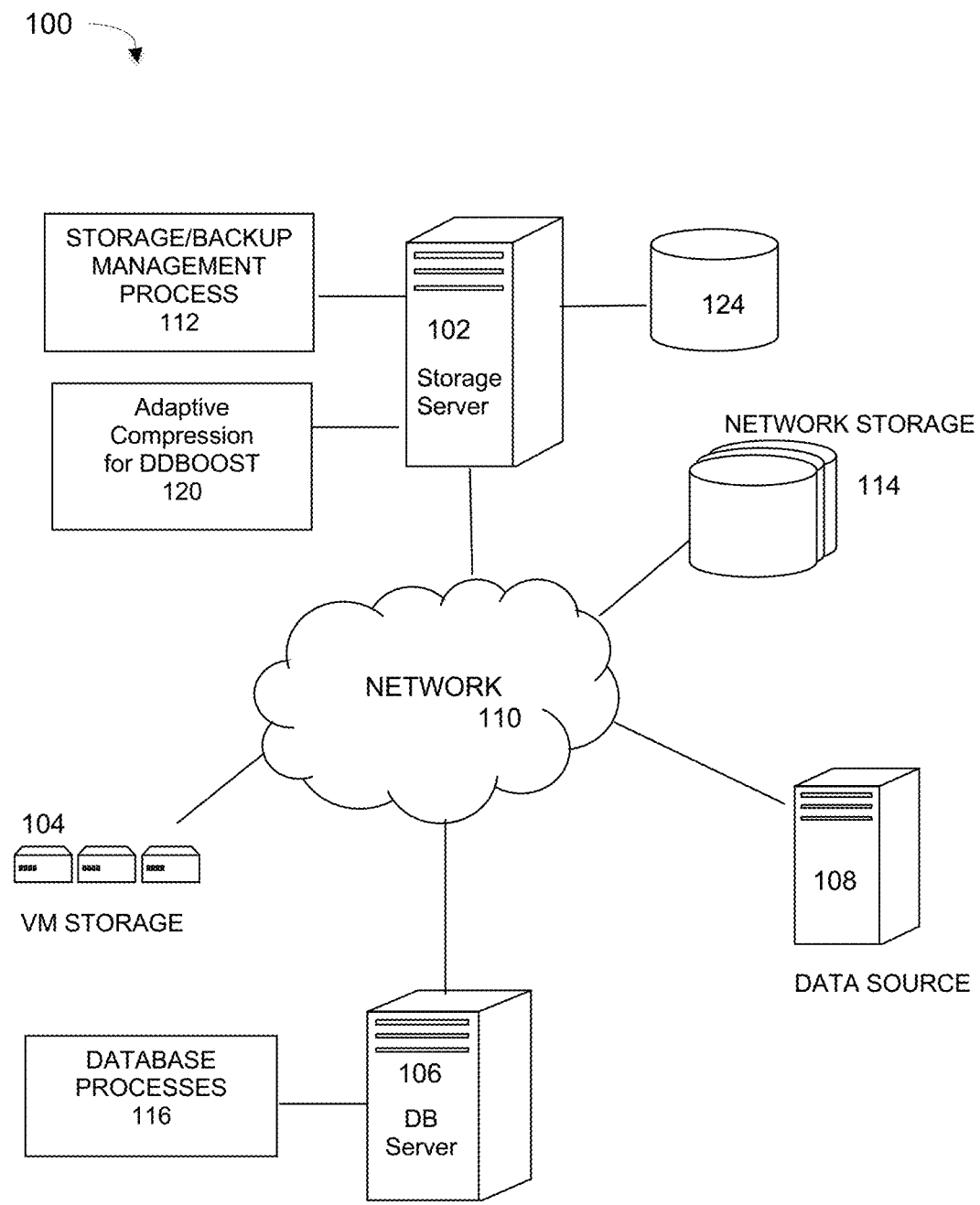
FIG. 1 illustrates a computer network system that implements one or more embodiments of an adaptive compression process for read operations in DDBOOST deduplication systems, under some embodiments.

A detailed description of one or more embodiments is provided below along with accompanying figures that illustrate the principles of the described embodiments. While aspects of the invention are described in conjunction with such embodiment(s), it should be understood that it is not limited to any one embodiment. On the contrary, the scope is limited only by the claims and the invention encompasses numerous alternatives, modifications, and equivalents. For the purpose of example, numerous specific details are set forth in the following description in order to provide a thorough understanding of the described embodiments, which may be practiced according to the claims without some or all of these specific details. For the purpose of clarity, technical material that is known in the technical fields related to the embodiments has not been described in detail so that the described embodiments are not unnecessarily obscured.

It should be appreciated that the described embodiments can be implemented in numerous ways, including as a process, an apparatus, a system, a device, a method, or a computer-readable medium such as a computer-readable storage medium containing computer-readable instructions or computer program code, or as a computer program product, comprising a computer-usable medium having a computer-readable program code embodied therein. In the context of this disclosure, a computer-usable medium or computer-readable medium may be any physical medium that can contain or store the program for use by or in connection with the instruction execution system, apparatus or device. For example, the computer-readable storage medium or computer-usable medium may be, but is not limited to, a random-access memory (RAM), read-only memory (ROM), or a persistent store, such as a mass storage device, hard drives, CDROM, DVDROM, tape, erasable programmable read-only memory (EPROM or flash memory), or any magnetic, electromagnetic, optical, or electrical means or system, apparatus or device for storing information. Alternatively, or additionally, the computer-readable storage medium or computer-usable medium may be any combination of these devices or even paper or another suitable medium upon which the program code is printed, as the program code can be electronically captured, via, for instance, optical scanning of the paper or other medium, then compiled, interpreted, or otherwise processed in a suitable manner, if necessary, and then stored in a computer memory. Applications, software programs or computer-readable instructions may be referred to as components or modules. Applications may be hardwired or hard coded in hardware or take the form of software executing on a general-purpose computer or be hardwired or hard coded in hardware such that when the software is loaded into and/or executed by the computer, the computer becomes an apparatus for practicing the invention. Applications may also be downloaded, in whole or in part, through the use of a software development kit or toolkit that enables the creation and implementation of the described embodiments. In this specification, these implementations, or any other form that the invention may take, may be referred to as techniques. In general, the order of the steps of disclosed processes may be altered within the scope of the invention.

Some embodiments of the invention involve software and systems deployed in a distributed system, such as a cloud based network system or very large-scale wide area network (WAN), metropolitan area network (MAN), however, those skilled in the art will appreciate that embodiments are not limited thereto, and may include smaller-scale networks, such as LANs (local area networks). Thus, aspects of the one or more embodiments described herein may be implemented on one or more computers executing software instructions, and the computers may be networked in a client-server arrangement or similar distributed computer network.

Embodiments are described for a method of optimizing the performance of client-side deduplication operations by adaptively invoking certain compression modes during read operations in a deduplication file system, such as those using DDBOOST (or similar mechanisms) to offload part of the deduplication process to a backup server or application client. Such a mechanism prevents the storage system or disk array (e.g., Data Domain system) from needing to carry the full deduplication workload. DDBOOST achieves this offloading capability by extending its software library to the backup server, thus enabling it to send only unique data segments to the storage target where it is then deduplicated against already stored backup data.

FIG. 1 illustrates a computer network system that implements one or more embodiments of an adaptive compression process for read operations in DDBOOST deduplication systems, under some embodiments. In system 100, a storage server 102 executes a data storage or backup management process 112 that coordinates or manages the backup of data from one or more data sources 108 to storage devices, such as network storage 114, client storage, and/or virtual storage devices 104. With regard to virtual storage 104, any number of virtual machines (VMs) or groups of VMs (e.g., organized into virtual centers) may be provided to serve as backup targets. The VMs or other network storage devices serve as target storage devices for data backed up from one or more data sources, such as storage server 102 or data source 108, in the network environment. The data sourced by the data source may be any appropriate data, such as database data that is part of a database management system, and the data may reside on one or more hard drives for the database(s) in a variety of formats. Thus, a data source maybe a database server 106 executing one or more database processes 116, or it may be any other sources data for use by the resources of network 100.

The network server computers are coupled directly or indirectly to the data storage 114, target VMs 104, and the data sources and other resources through network 110, which is typically a cloud network (but may also be a LAN, WAN or other appropriate network). Network 110 provides connectivity to the various systems, components, and resources of system 100, and may be implemented using protocols such as Transmission Control Protocol (TCP) and/or Internet Protocol (IP), well known in the relevant arts. In a cloud computing environment, network 110 represents a network in which applications, servers and data are maintained and provided through a centralized cloud computing platform.

The data generated or sourced by system 100 and transmitted over network 110 may be stored in any number of persistent storage locations and devices. In a backup case, the backup process 112 causes or facilitates the backup of this data to other storage devices of the network, such as network storage 114. In an embodiment network 100 may be implemented to provide support for various storage architectures such as storage area network (SAN), Network-attached Storage (NAS), or Direct-attached Storage (DAS) that make use of large-scale network accessible storage devices 114, such as large capacity disk (optical or magnetic) arrays, such as RAID (redundant array of individual disk) arrays. In an embodiment, system 100 may represent a Data Domain Restorer (DDR)-based deduplication storage system, and storage server 102 may be implemented as a DDR Deduplication Storage server provided by EMC Corporation. However, other similar backup and storage systems are also possible.

The Data Domain File System (DDFS) from DellEMC is an example deduplication filesystem in which the filesystem anchors and segments data as it is ingested. The filesystem keeps track of segments which are stored on the disk, and if the segments are accessed again, the filesystem just stores a reference to the original data segment that was written to disk. A file is therefore a stream of segments, and these segments are uniquely identified by a key/label data element, called a fingerprint. Given a file offset and length, the corresponding data segment fingerprints need to be looked up to access the actual data.

Deduplication filesystems are designed to optimize the performance and capacity of ingested/backup data. Advanced filesystems, like PowerProtect Data Domain filesystems from DellEMC, also support and leverage the DDBOOST protocol, which is a bandwidth optimized protocol providing client-side deduplication. While DDBOOST reduces the network traffic for ingestion into the PowerProtect Data Domain system, file-level restores involving read operations still require the full bandwidth, as each byte in the file must be read and transferred over the network.

There are cases where the network is a bottleneck and the available network bandwidth available is limited either on the client or the backup appliance. DDBOOST has a built-in compression mode of data transfers (e.g., using LZ compression) where the remote procedure call (RPC) transfers are compressed on the Data Domain system and then decompressed on the client. To use the compressed transfer mode, the client must open the file stream in the compressed transfer mode. While this technique reduces network bandwidth, it involves compression, which can be a very processor-intensive process, i.e., requiring many CPU cycles. Since the read operations are generally not bandwidth optimized, the filesystem server may need to compress great amounts of data, and which then need to be decompressed at the client. The CPUs in the system (both client and server) are generally limited, and this CPU usage by compression and decompression operations may destabilize the system. As a result, the DDBOOST compression feature is actually rarely used, as application users have little insight into the processor impact or even the compressibility of the data. In a deduplication filesystem, read operations thus pose an issue with respect to CPU usage, even when certain compression modes may be offered, such as with DDBOOST systems, as mentioned above.

Embodiments of system 100 include an adaptive (or opportunistic) compression process/component 120 for use with DDBOOST applications. Such a system tracks the CPU usage on both the client and the server and compresses the data egress buffers if there is a sufficient amount of CPU bandwidth available, such that when there is an opportunity to use compression, the system does so. The client then intelligently decompresses the data only if the server has compressed the data. In such a system, a user need not explicitly choose compression or no compression, but instead, the system will optimally select compression when it is advantageous to do so, and will read the data in uncompressed (or 'non-compressed') form when processor usage is deemed excessive. It should be noted that the term "CPU" generally refers to a central processing unit of a computer, and may also be referred to generally as a processor, or any other computing unit that executes program instructions in a backup system. A processor may also include one or more co-processors, such as a DPU (data processing unit), GPU (graphics processing unit), and so on.

Embodiments are generally described with respect to Data Domain File System (DDFS) backup environments, however, embodiments are not so limited and any other type of deduplication file system may also be used. The Data Domain File System (DDFS) is an example of an inline data deduplication filesystem. As data gets written to the filesystem, DDFS breaks it into variable sized segments and a group of segments are packed in a compression region. A number of compression regions are grouped together and written as a container to disk. DDFS calculates fingerprint signatures for each segment using SHA1 algorithm. DDFS has an on-disk fingerprint index table, which maps the fingerprint to the container-ID, that has the corresponding segment data. The container has a metadata section followed by several data sections. The data sections store the compression regions; and the container metadata section stores the meta information of the container, i.e., it stores the total number of compression regions, the total number of segments, the fingerprint of each segment, and so on.

In a deduplicated filesystem that forms segments from data, these segments are uniquely identified by their key/label called as fingerprint. Given a file offset and length, the corresponding data segment fingerprints need to be looked up. To provide faster offset to fingerprint lookup the mapping is stored in a Merkle tree format where the leaf nodes represent data segments and their fingerprints are stored in the parent nodes which are metadata segments. In a Merkle tree, every non-leaf node is labeled with the hash of the labels of its children nodes to allow efficient and secure verification of the contents of large data structures.

A file in DDFS is represented by a Merkle tree with user data as variable sized segments at the bottom level of the tree, referred to as L0 segments. The SHA1 fingerprints of those segments are grouped together at the next higher level of the tree to form new segments, referred to as L1 segments. SHA1 fingerprints of L1 segments are grouped together as L2 segments, and this continues up to L6 which represents the entire file. The top segment of the tree is always an L6 segment, even though it may refer to any lower numbered segments. Segments above L0 are referred to as Lp chunks. The L6 segment of every file is stored in a namespace which is represented as a B+ Tree. The L0 and Lp segments are written to separate containers, known as L0 and Lp containers.

Figure 2:
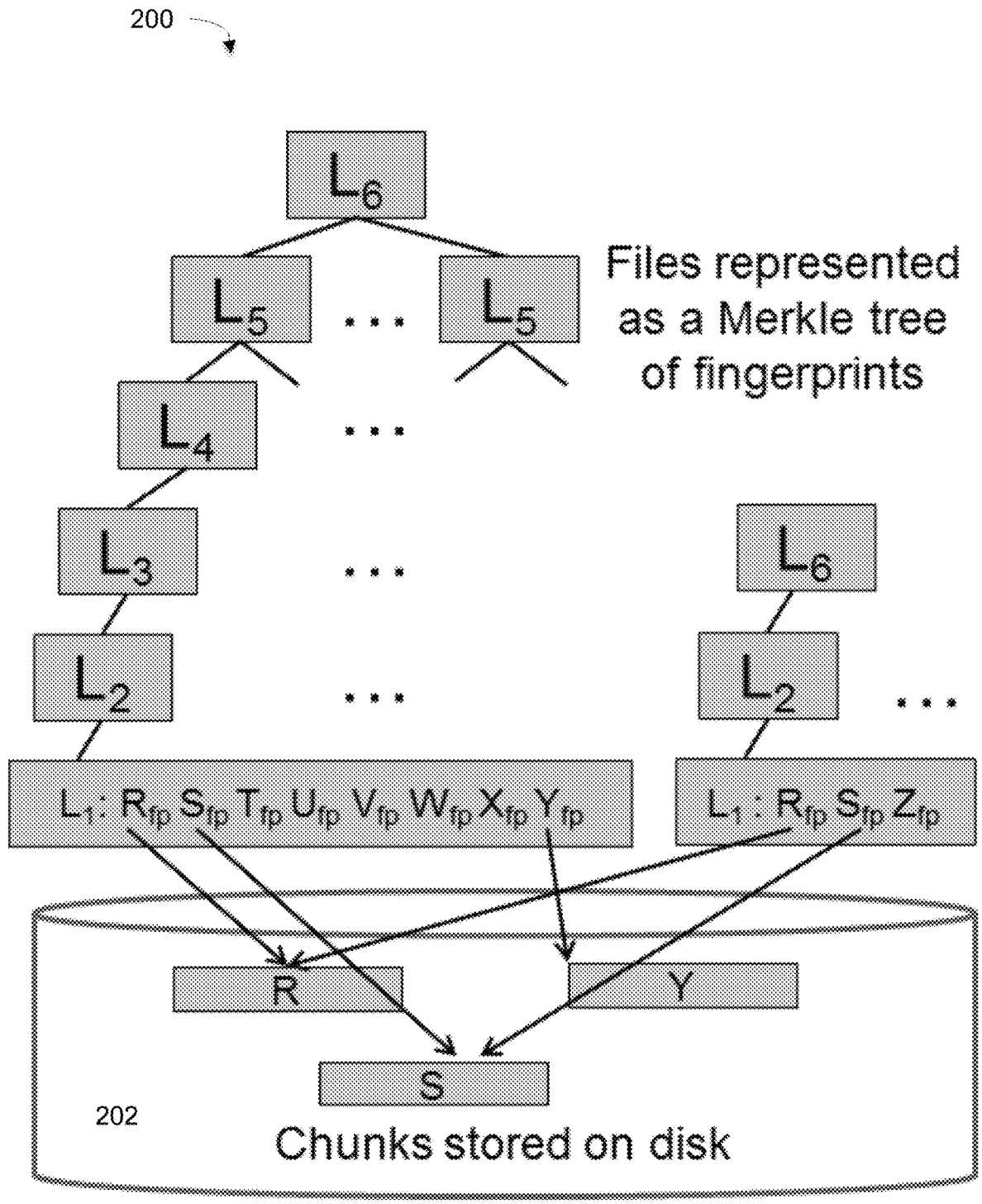
FIG. 2 illustrates files an example Merkle tree representation of files in a deduplication backup system, under some embodiments.

FIG. 2 illustrates files an example Merkle tree representation of files in a deduplication backup system, under some embodiments. As shown in FIG. 2, Merkle tree 200 comprises layers L0 to L6. The chunks directly written to disk 202 are referred to as $L_0$, meaning the lowest level of the tree. Consecutive $L_0$ chunks are referenced with an array of fingerprints by an $L_1$ chunk, which itself is identified by a fingerprint. An array of $L_1$ fingerprints is referenced by an $L_2$ chunk, continuing to the root of the tree; the root is always labeled $L_6$ for convenience, even if the file is small enough not to need intermediate nodes such as the example on the right side of the figure. The $L_1$-$L_6$ chunks are referred to as Lp chunks, where p is a parameter that ranges from 1 to 6 and indicates metadata representing the file. Deduplication takes place because a chunk can be referenced multiple times. The file system is a forest of Merkle trees, but these trees are not disjoint, particularly at the lowest level. In general, Lp chunks are themselves stored on disk in containers, which include a relatively small (hundreds of KB) metadata section with a list of fingerprints for the chunks within the container. Thus, they may be read more quickly than the full container.

A Data Domain or similar system can efficiently copy an existing file using the same underlying Merkle tree. It creates the new file with a new name, and therefore a new $L_6$ root of the tree, but that tree then references the identical $L_P$ chunks. As this operation involves only the root of the tree, it is trivially fast and does not increase physical space in use beyond the one chunk containing the $L_6$.

Figure 3:
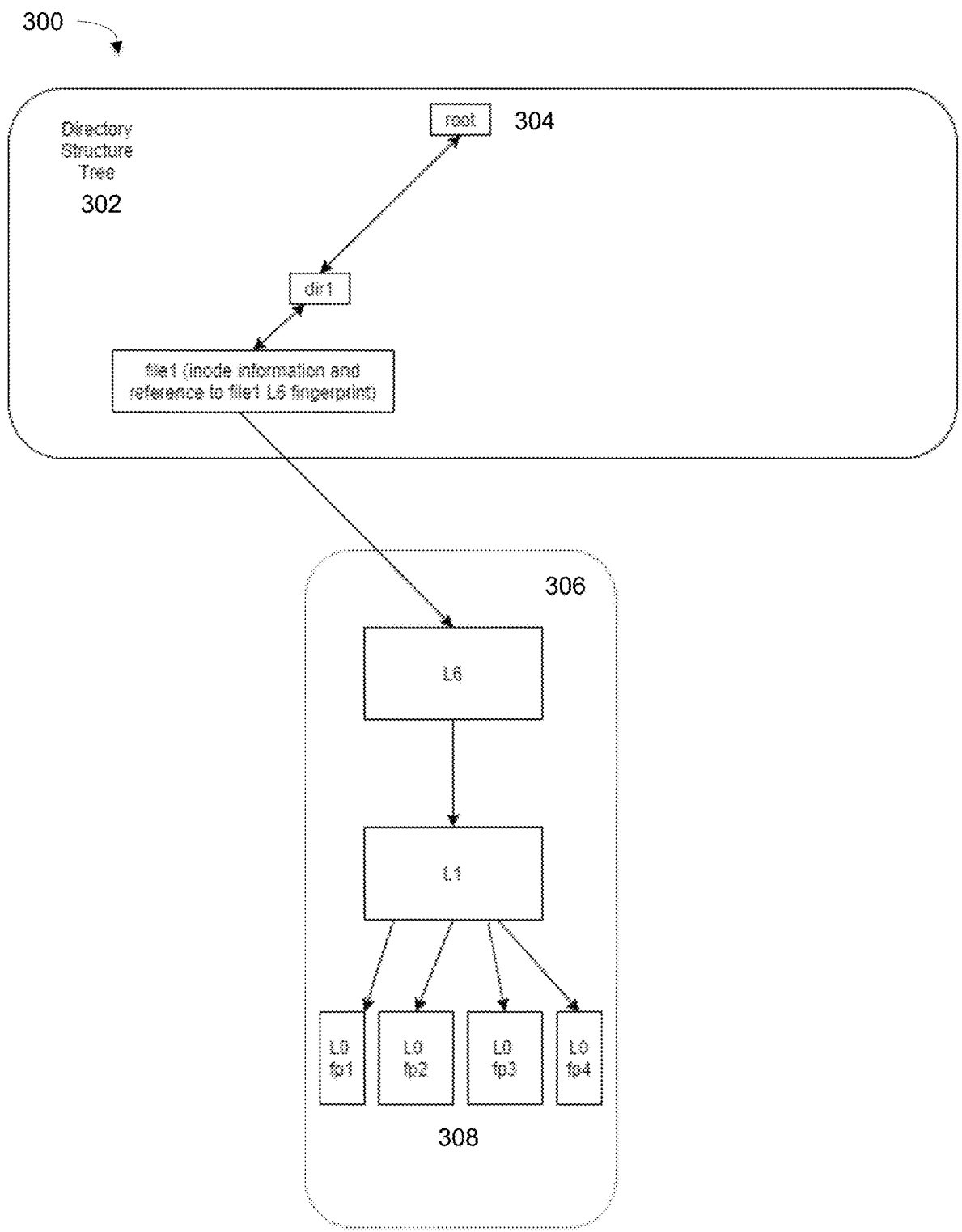
FIG. 3 illustrates a Data Domain filesystem Merkle tree accessed by a file under an example embodiment.

FIG. 3 illustrates a DDFS Merkle tree accessed by a file under an example embodiment. As shown in system 300, a directory structure tree 302 comprises a root directory 304, which accesses a directory (dir1) that holds a particular file (file1). The directory tree data for file1 comprises inode information and a reference to the file1 L6 fingerprint in the associated Merkle tree 306.

As mentioned above, the data chunks directly written to disk are referred to as $L_0$, meaning the lowest level of the tree, and which hold the respective fingerprints (fp1 to fpn). Consecutive $L_0$ chunks are referenced with an array of fingerprints by an $L_1$ chunk, which itself is identified by a fingerprint. An array of $L_1$ fingerprints is referenced by an $L_2$ chunk, continuing to the root of the tree; the root is always labeled $L_6$ for convenience, even if the file is small enough to not need intermediate nodes. The $L_1$-$L_6$ chunks are referred to as Lp chunks, where p is a parameter that ranges from 1 to 6 and indicates metadata representing the file. Deduplication takes place because a chunk can be referenced multiple times. The filesystem is a forest of Merkle trees, but these trees are not disjoint, particularly at the lowest level.

As mentioned above, the DDFS performs inline deduplication of backup data by filtering the data as it is being ingested and only storing data that is not already available on the data protection appliance. Such inline deduplication can be done as a server-side process by filtering the data on the data protection appliance itself, or as a client-side process by filtering on the backup client, which results in network and performance savings as only new data needs to be transmitted.

In some embodiments, the deduplication functions of process 112 are implemented by extending a Data Domain application programming interface (API) to improve restore operations in deduplication backup systems. In an embodiment, such an API extension is implemented on DDBOOST APIs as provided by DellEMC, or any API for similar protocols. The Data Domain filesystem works with a propriety library, called Data Domain Bandwidth Optimized Open Storage Technology (OST), or "DDBOOST." This library links with the application to reduce the bandwidth required by ingests. This method translates the application read and write requests to DDBOOST APIs.

As mentioned above, DDBOOST is a system that distributes parts of the deduplication process to the backup server or application clients, enabling client-side deduplication for faster, more efficient backup and recovery. A data storage deployment may use any combination of interfaces simultaneously to store and access data. The clients, which may be referred to as DDBOOST clients, may use the DDBOOST backup protocol to conduct backups of client data to the appliance pool, restore the backups from the appliance pool to the clients, or perform other data protection operations. The DDBOOST library is extended to the backup server, and exposes APIs to integrate with a Data Domain system using an optimized transport mechanism. These API interfaces are exported by the DDBOOST Library to provide mechanisms to access or manipulate the functionality of the DDFS. Embodiments may utilize the DDBOOST File System Plug-In (BoostFS), which resides on the application system and presents a standard file system mount point to the application. With direct access to a BoostFS mount point, the application can leverage the storage and network efficiencies of the DDBOOST protocol for backup and recovery. Some specific embodiments are described in conjunction with storage systems, products, and services referred to as Data Domain as provided by Dell EMC. It should be appreciated, however, that the described systems and techniques can be applied to other similar storage systems, products, and services. For example, some specific embodiments are described in conjunction with the DDBOOST protocol. Aspects and principles of embodiments described, however, are applicable to other protocols such as NFS, CIFS, and others.

Figure 4:
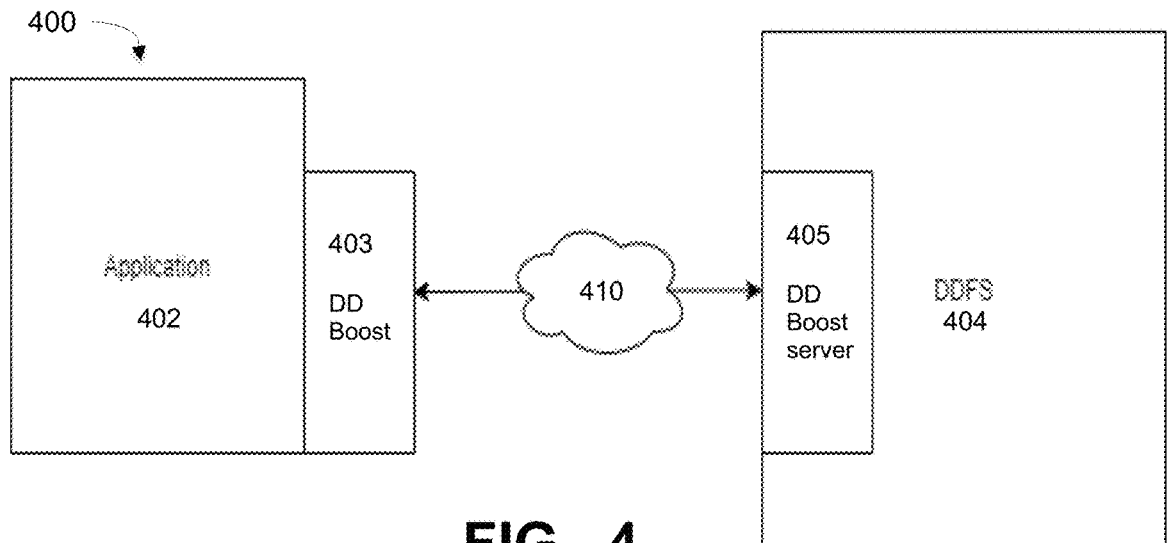
FIG. 4 illustrates the use of DDBOOST APIs in conjunction with a Data Domain file system, under some embodiments.

FIG. 4 illustrates the use of DDBOOST APIs in conjunction with a DDFS system 400, under some embodiments. As shown in FIG. 4, for a backup application, client-side DDBOOST library 403 interacts through the DDBOOST API to the DDFS system 404 through a DDBOOST server process 405. For an ingest, or restore process, the application 402 issues an open file, which is followed by a series of read or write requests, which are then followed by a file close.

Figure 5:
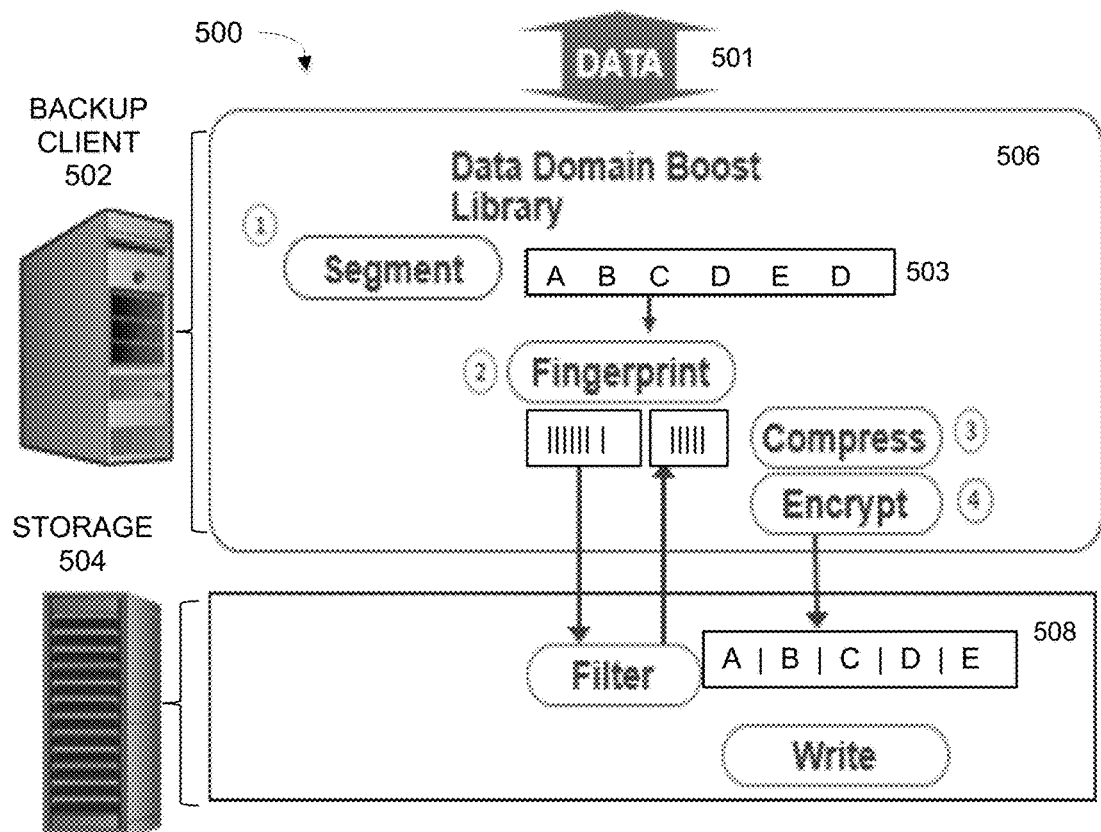
FIG. 5 illustrates a process of performing distributed or client-side inline deduplication using a DDBOOST library, under some embodiments.

The following code snippet is a generic example of a DD Boost API, to open a file and specify the operation, in this case for reading.

boost_open_file (file_path, FLAG=FOR_READING, &file_handle);

This would be followed by read requests:

boost_read(file_handle, offset, length, &buffer);

The DDBOOST library offers additional options for opening/reading, but the above simply provides a generic interface with parameters needed to support client-side deduplication. FIG. 5 illustrates a process of performing distributed or client-side inline deduplication using a DDBOOST library, under some embodiments. As shown in FIG. 5, system 500 includes a backup client 502 that sources data to be backed up to network storage 504, such as a PowerProtect system. As data 501 is ingested by the backup process, the backup client 502 utilizes the DDBOOST library 506 to perform the following processing stages: (1) calculate where to break the data 501 into segments 503 (e.g., rolling checksum); (2) perform a fingerprint (reference) calculation (e.g., SHA1 hash value); (3) compress the data segment; and (4) encrypt the data (when configured to do so). The DD Boost library 506 sends the hashed fingerprints for filtering to the Data Domain system, queries for the filtering results, and then compresses and sends data identified as new. These steps continue for the duration of the processing.

Figure 6:
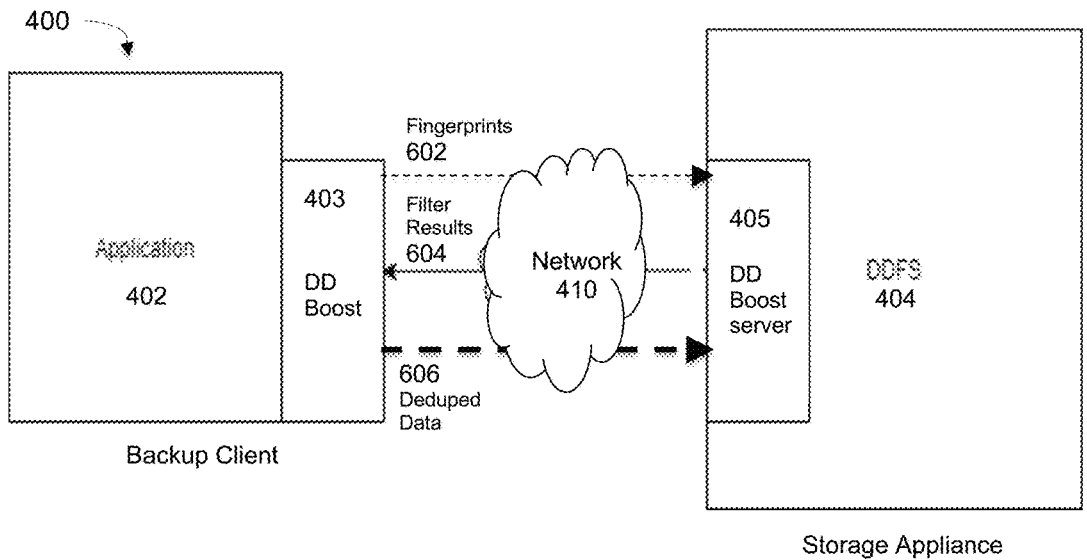
FIG. 6 illustrates the operation of the system of FIG. 4 during a data restore process, under some embodiments.

FIG. 6 illustrates the operation of the system of FIG. 4 during a data restore process, under some embodiments. For a data ingest (or restore) process, the application 402 issues an open file, which is followed by a sequence of read or write requests. This is followed by the file close. When the DDBOOST library is linked, the open request is changed to be DDBOOST API, which is received by the DDBOOST server 405 running within the DDFS storage appliance 404. The DDBOOST server 405 interprets this call open an API and internally calls the filesystem open API. If the application 402 chooses to write data to this file descriptor, the DDBOOST library intelligently processes by: (1) segmenting the data at data-dependent anchor points, (2) calculating fingerprints 602 and sending them to the DDFS appliance 404, and (3) requesting filtering results 403. This illustrates the client-side deduplication functionality and saves a great deal of network bandwidth, as any segment that is filtered out does not need to be sent over the network interface. The new/deduplicated data 606 is then sent from the application 402 to the DDFS storage appliance 404.

If the application 402 chooses to restore a file, the read request is sent to the DDBOOST server, which requests the filesystem for the data. The restore must, however, read the entire file, and there is no network bandwidth advantage to use DDBOOST. The close from the application destroys the DDBOOST connection and the stateful context it has established with the server.

The DDBOOST system has a built-in compression mode of transfer, where the RPC transfers are compressed on the DDFS side 404, and decompressed on the client 402. To use the compressed transfer mode, the client must open the file, such as by providing a flag to request this option, as the default mode may be set to read in un-compressed form.

Depending on the number of streams, compression can yield up to 1.5 times faster data transfer times for 2:1 compression and 2.5 times faster transfer times for 9:1 compression, for example. However, while this built-in compression feature reduces network bandwidth and can significantly improve restore performance, it can be a highly CPU-intensive task. Since the reads are not bandwidth optimized, the filesystem server 704 will need to process large amounts of data.

Figure 7:
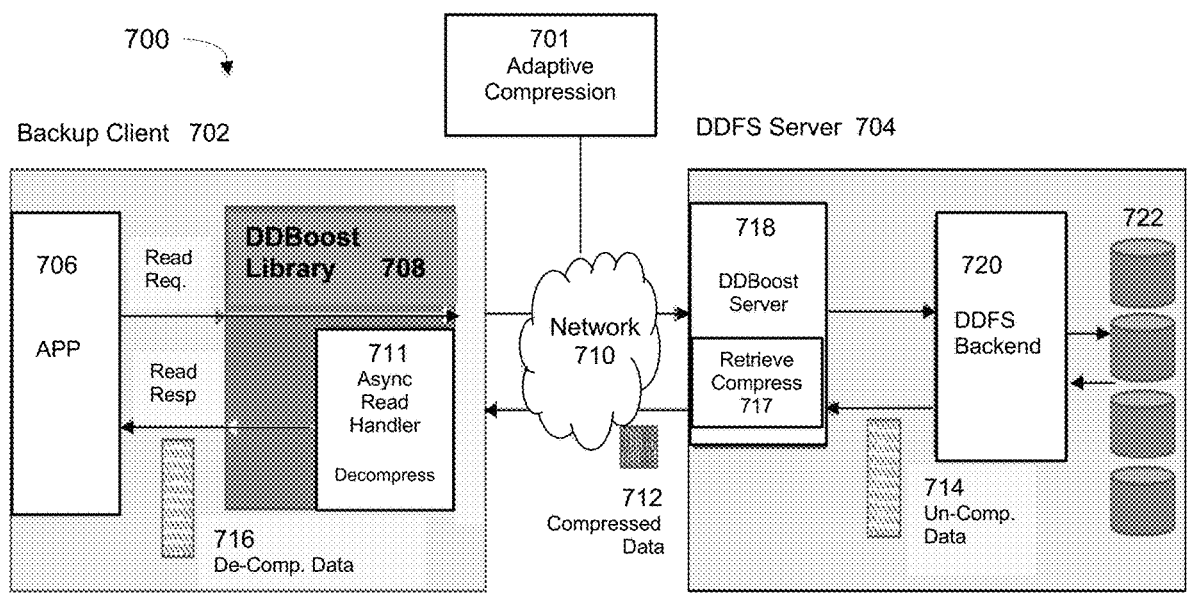
FIG. 7 illustrates a DDBOOST system in operation using a built-in compression mode, under some embodiments.

FIG. 7 illustrates a DDBOOST system in operation using a built-in compression mode, under some embodiments. As shown in FIG. 7, system 700 comprises a backup client 702 coupled to a DDFS server 704 over network 710. The backup client 702 includes an application 706 and the DDBOOST library 708, which in turn, holds an asynchronous read handler 711. The application 706 sends a read request to the DDBOOST library 708, which transmits it to the DDBOOST server 718 on server 704 for retrieval of data from storage 722 by the DDFS backend 720. The retrieved data is uncompressed 714 from the storage and backend. It is compressed by the compression function 717 of the DDBOOST server 718, where it is transmitted back to the client 702 as compressed data 712. This data is then received by the read handler 711 in the DDBOOST library 708, where it is decompressed to form de-compressed data 716, and returned back to the application as a read response.

As shown in FIG. 7, system 700 includes an adaptive compression processing component that automatically selects or prevents enablement of the built-in DDBOOST compression function 717. With respect to this compression function 717, the DDBOOST client library provides an option to enable compressed read through a DDBOOST read API input parameter (or similar mechanism). When the application selects this option, the DD Boost library sends a READ remote procedure call to the DDR with an additional metadata flag setting to indicate it should compress the response. The read processing on the Data Domain Restorer (DDR) works as it normally would, retrieving data containers stored on disk and then decompressing them. The portion of the data requested is then sent to the DDBOOST Server on the DDR. The DDBOOST server then compresses this data using LZ compression (or similar) and sends it to the client in a READ_REPLY remote procedure call with a flag indicating the data is compressed. The DDBOOST client then decompresses the data received and writes it to the application's read response buffer. The compression on the server and decompression done by the client is transparent to the application. With respect to FIG. 7, application 706 sends the read request to the DD Boost client library with the compress flag enabled. The DDBOOST server 718 receives the request and this is passed to the backend 720. The server 718 then receives the data from the backend 729 in non-compressed form 714, and (if enabled), it compresses the data using its built-in compression function 717, and sends it in compressed form 712 to the client 702. The DDBOOST client library 708 listens for the read response, and the async read handler 711, receives the reply, checks for the flag indicating that the data is compressed, and decompresses to generate de-compressed data 716 for return to the application 706. If the built-in compression and de-compression functions are not enabled and used, the data read by the application is retrieved from storage 722 by server 704 and sent back to the client 702 in non-compressed or cleartext format.

With respect to the built-in compression function 717, DDBOOST typically uses lossless compression algorithms, such as LZ (Lempel-Ziv) compression. However, it should be noted that any appropriate type of compression method may be used, such as e.g., Huffman encoding, GZ (Gzip), among others.

As can be seen in FIG. 7, this read operation involves server CPU cycles for the compression function 717, and client CPU cycles for the decompression 716 function. If sufficient processor resources (i.e., CPU cycles), as determined on a per-read request basis, are not available in either or both of the server and client, compression should not be performed, and the bandwidth of the network 710 should be utilized to transfer the non-compressed data. as retrieved by the DDFS backend 720.

Embodiments of system 700 thus include an adaptive compression process 701 that applies compression opportunistically by compressing the egress buffers if there is a sufficient available CPU. The process 701 tracks the CPU on both the client and the server and invokes the compression 717 function for a particular read request only if both the server and client have sufficient processor resources available. The client includes intelligence through the read handler 711 to perform decompression only if the server has compressed the data through 717.

Depending on system configuration, the adaptive compression function 701 may be provided as a component in either or both of the client 702 or server 704, or as a cloud-based process in network 710.

Figure 8:
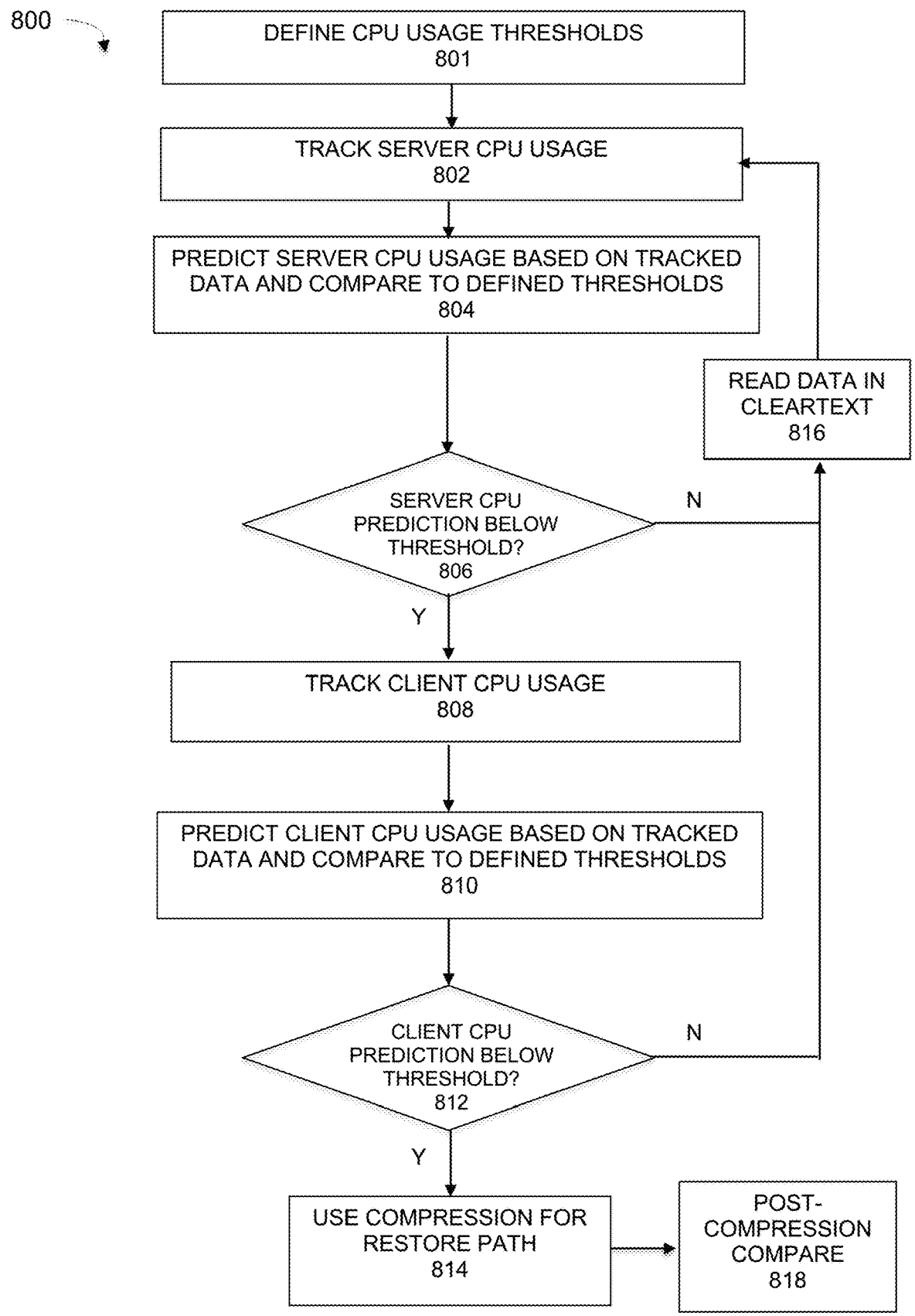
FIG. 8 is a flowchart illustrating a method of providing adaptive compression for read operations in DDBOOST systems, under some embodiments.

FIG. 8 is a flowchart illustrating a method of providing adaptive compression in DDBOOST systems, under some embodiments. Process 800 starts by tracking the server CPU usage, 802 per unit time ('epochs') for comparison against defined thresholds 801. In an embodiment, the CPU usage refers to the amount of time the CPU is performing 'real' work such as processing interrupts, executing purposeful program code, as opposed to being in an idle state, such as with no jobs scheduled and waiting for next instruction. Such usage is expressed as a percentage of work on a scale of 0 to 100% with 0% being idle, 50% being half used, 100% being fully used, and so on. Usage can actually be measure based on the idle time. For example, if a CPU is measured at 65% idle, this means that it is 35% used. Usage may be expressed as a single percentage value, or a range of percentages covering usage characteristics, such as unused, partially used, significantly used, fully used, and so on. For the client-server system of FIG. 7, there are at least two CPUs to be tracked and measured, one in server 704 and one in client 702. In general, the usage of both CPUs must be considered when determining whether or not enough system-wide processing power exists to support both compression (in the server) and decompression (in the client). The same threshold may be used for both client and server, or different thresholds may be used, such as in cases where the client and server are embodied in different machines and/or where present and expected load and processing requirements may be different between clients and servers.

In an embodiment, one or more threshold values or ranges may be defined and used to distinguish various scales of CPU usage, 801. For example usage between 75% to 100% may indicate a CPU that is fully used, while anything else is characterized as unused or under-used. In this case, the threshold may be 75 to determine that a CPU running above this threshold is fully used and cannot be further burdened with processing tasks. This may also be provided as a range, such as from 60% to 80%, etc. Such values are provided for purposes of example only, and any other appropriate threshold value or range may be used depending on system configuration, application requirements, resource limitations, and so on. The threshold may thus be defined as a maximum usage value above which the CPU is judged to be operating with insufficient capacity to perform any compression operations.

In an embodiment, after obtaining tracked server CPU usage data in step 802, the process predicts future or near-future server CPU usage. The same is done for the client as well (steps 808-810). In an embodiment, this prediction may be done by a number of different methods, such as statistical methods or artificial intelligence/machine learning processes, and so on, as described in greater detail below.

Based on comparing the tracked data to the defined threshold value or values, the process predicts CPU usage 804 to determine if a present prediction of the server CPU is below the threshold (or within a defined threshold range), 806. If the predicted tracked server CPU usage is below the threshold, it is assumed that the server CPU has enough resources to allow compression so the process next tracks the client CPU usage, 808. The process predicts the client CPU usage based on the tracked data relative to defined threshold value or values, 810. If the client CPU usage prediction is below the threshold, as determined in block 812, the process uses the available compression feature for the restore path, 814, such as the built-in DDBOOST compression 717. As shown in method 800, such compression will only be used if both the server CPU and client CPU usages are within the acceptable threshold range. If either is above the threshold, or their respective thresholds, data will be read using cleartext, 816, and the process will continue to track the CPU usage (802, 808) until this condition is met with respect to using compression.

With respect to the predicting available CPU usage on either the server or client (as shown in steps 804 and 810 of FIG. 8), the system 700 can use any appropriate statistical or machine learning algorithms to track and predict available CPU bandwidth.

Figure 9:
FIG. 9 illustrates a set of buffers for use in calculating moving averages to predict available CPU bandwidth, under some embodiments.

In an embodiment, a statistical method of moving averages is used to predict the CPU usage on either or both the server and client. For this embodiment, a set of n buffers will be used, which will store the instant used CPU percentage over the last 'n' epochs. FIG. 9 illustrates a set of buffers for use in calculating moving averages to predict available CPU usage, under some embodiments. As shown in FIG. 9, data structure 900 comprises a number n of buffers numbered sequentially 1, 2, 3, 4, . . . , n–4, n–3, n–2, n–1, n. Each buffer holds a CPU value for a set period of time (epoch), such as one second. Thus, for example, a buffer where n is 30 would hold the CPU values for the last 30 seconds with each buffer capturing one value, for the last 30 seconds, where the CPU 'value' is represented as percentage usage on a scale of 0 to 100%. The buffer can be implemented as a circular buffer, wherein the oldest value is replaced by the latest CPU captured value. The average of these buffers can smoothen out the spikes in the CPU consumption, and a provide a reasonably accurate measure of the CPU used and CPU available. Other types of buffers can also be used.

This moving average process will be able to predict the available CPU in the next few epochs where this value will be used. In an example embodiment, assume that the 30 values of the CPU sampled, once a second are as follows:
list=[45, 44, 40, 38, 35, 34, 35, 33, 34, 34, 36, 35, 34, 30, 31, 32, 33, 37, 36, 35, 35, 34, 33, 31, 34, 31, 31, 33, 32, 33]

Each value represents a percentage value, 45%, 44%, 40%, etc. The latest value is inserted into the head. The average of this set is Sum(list) divided by the number of elements (list). In this case, the average is 34.6% usage.

At the next sample, the oldest value (33) is removed, and the list is as follows:
list=[45, 44, 40, 38, 35, 34, 35, 33, 34, 34, 36, 35, 34, 30, 31, 32, 33, 37, 36, 35, 35, 34, 33, 31, 34, 31, 31, 33, 32]

The calculated value (e.g., 34.6) is then used as a data point to help predict the future usage. For this example, the new value of 35 (34.6 rounded up) is inserted to the head so that the list becomes:
list=[35, 45, 44, 40, 38, 35, 34, 35, 33, 34, 34, 36, 35, 34, 30, 31, 32, 33, 37, 36, 35, 35, 34, 33, 31, 34, 31, 31, 33, 32].

The average for this instance is 34.66%. This method would smoothen the curve and predict the CPU usage percentage based the tracked (past) values. This moving average example illustrates one method to predict CPU usage based on a previous period of time.

An alternative embodiment is to use a weighted moving average. For the weighted moving average process, weights associated with each element of the epoch. As an example, weights can be assigned and distributed to make the most recent CPU usage the more relevant relative to earlier CPU usage times.

Instead of prediction using statistical methods, certain machine learning or artificial intelligence (ML/AI) algorithms may be used. For example, ML algorithms like piecewise linear regression-based prediction or time-series analysis methods like auto-regression integration moving average (ARIMA) may be used to predict the CPU for the next epoch.

The prediction process (either statistical or AI/ML) provides a prediction of the amount of available CPU bandwidth in the next epoch or next several epochs, and as shown in FIG. 8, if the predicted available CPU bandwidth is within some set thresholds, compression will be employed. This calculation is done for both the server and the client, since, if the clients do not have the available CPU, the extra CPU required to decompress the data could still destabilize the system. Thus, as shown in FIG. 8, the impact of the tracking and prediction of the client CPU usage is also used and combined with the server CPU usage to determine whether or not to use compression in the overall system.

Figure 10:
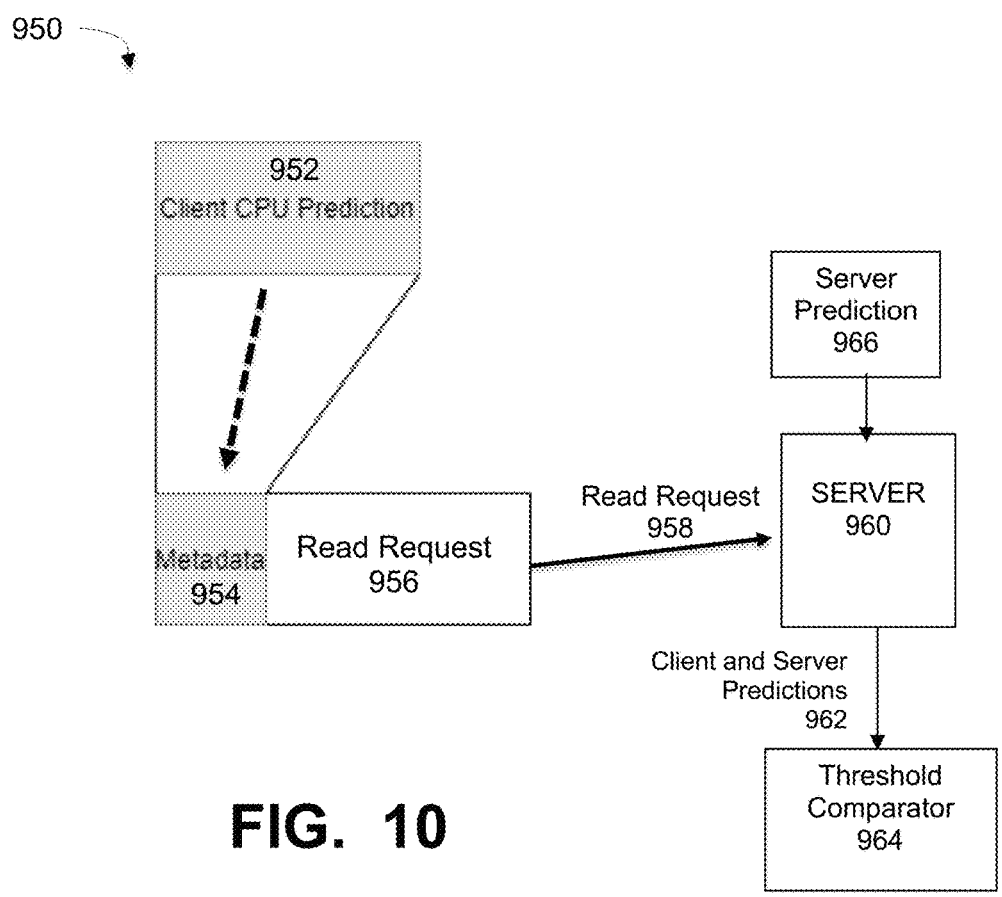
FIG. 10 illustrates an expanded request header for a storage client for CPU usage prediction, under some embodiments.

To obtain the client-side CPU history, embodiments expand the request header with certain metadata, which carries the client-side CPU history. FIG. 10 illustrates an expanded request header for a storage client for CPU usage prediction, under some embodiments. For this embodiment, the process calculates the client CPU prediction value using either the statistical or AI/ML process described above. The client CPU prediction value 952 is appended as metadata to the read request sent from the client (e.g., 702) to the server (e.g., 704). Thus, as shown in FIG. 10, The client sends its CPU prediction value 952 as metadata in field 954 appended to the read request from request buffer 956. This is sent as part of the request to read a certain buffer 958 to the server 960. The adaptive compression process (in or coupled to the server) then uses this with the server CPU prediction 966 from the server 960 as input 962 to the threshold comparator or threshold comparators (if different client and server threshold values are used) 964.

In an embodiment, the client CPU prediction 952 may be optional and used only if the client chooses to send its predicted CPU value, and the server can cache this value in the per connection metadata field 954 appended to the request buffer 956 on the server. This process uses the metadata for a client (or each client) per read request.

Certain optimization techniques can also be used to further inform the decision blocks (806, 812) and determine whether or not (or when) compression should be used. For example, the process may decide to not compress if the compression provides little to no savings. For example, in some cases, the data itself is not very compressible and not worth the overhead of executing the compression on the server and decompression on the client. In some worst case scenarios, the data may even expand when the compression is applied. For example, the LZ algorithm has been known to inflate the compressed data by up to 1.08 times over the size of the non-compressed data (thus the compressed size>non-compressed size). This can occur because of various reasons, such as the class of data (e.g., files with random data), and so on. In this case, if either the data does not achieve a compression threshold or expands, the system should send non-compressed data.

In an embodiment, an indicator in the read response may be used to indicate the format of the data. If it is not compressed due to one of these reasons, the client-side decompression processing can be bypassed, saving CPU cycles. This detection removes the requirement on the application to select when to use compressed restore. If there are any savings gained by compression it will be used, otherwise system will not use compression.

For this method, the process 800 performs a post compression step 818 of comparing the compressed file with the non-compressed file. If the compressed file is not significantly smaller than the non-compressed file, the built-in compression process will not be used. For this embodiment, a size-difference threshold value maybe defined such as on the order of 25 to 33% size reduction to trigger the compression, with a balance between the size savings versus the additional CPU and network bandwidth. This is only one example, and other compress/non-compress size thresholds can also be used.

In an embodiment, the choice of the compression algorithm may also be considered. While LZ is considered to be a fast algorithm, algorithms like GZ and GZfast are much more space optimal. However, they can add significant CPU penalty and latency. In some cases, such as where the bandwidth is at a premium, however, these algorithms may be employed as a matter of choice.

Embodiments of the adaptive compression process for DDBOOST thus provide a method to use compression adaptively and to improve reads on a deduplication file system. It provides a method to predict the CPU usage on the client and the deduplication filesystem, and a method to use ingest time compression information (for a file, or for a section of a file) to choose compression on restore operations in the deduplication filesystem.

Embodiments of the processes and techniques described above can be implemented on any appropriate backup system operating environment or filesystem, or network server system. Such embodiments may include other or alternative data structures or definitions as needed or appropriate.

Figure 11:
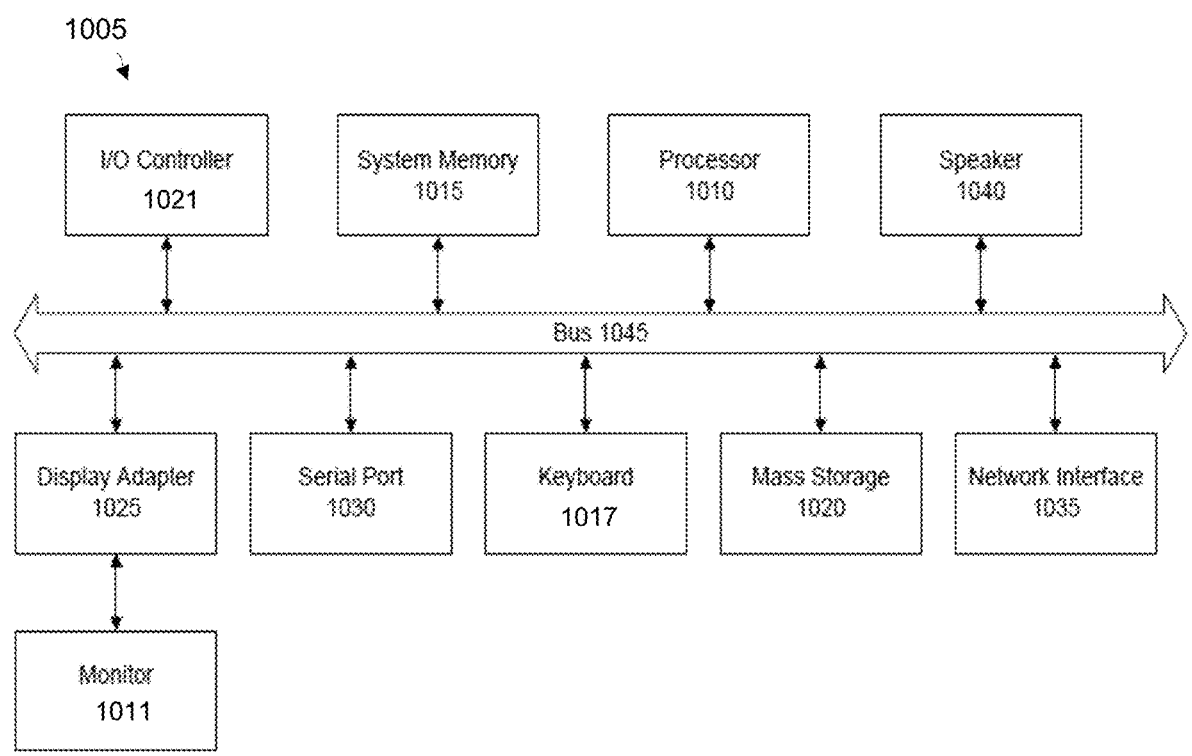
FIG. 11 is a block diagram of a computer system used to execute one or more software components of the methods and processing component described herein, under some embodiments.

The network of FIG. 1 may comprise any number of individual client-server networks coupled over the Internet or similar large-scale network or portion thereof. Each node in the network(s) comprises a computing device capable of executing software code to perform the processing steps described herein. FIG. 11 shows a system block diagram of a computer system used to execute one or more software components of the present system described herein. The computer system 1005 includes a monitor 1011, keyboard 1017, and mass storage devices 1020. Computer system 1005 further includes subsystems such as central processor 1010, system memory 1015, I/O controller 1021, display adapter 1025, serial or universal serial bus (USB) port 1030, network interface 1035, and speaker 1040. The system may also be used with computer systems with additional or fewer subsystems. For example, a computer system could include more than one processor 1010 (i.e., a multiprocessor system) or a system may include a cache memory.

Arrows such as 1045 represent the system bus architecture of computer system 1005. However, these arrows are illustrative of any interconnection scheme serving to link the subsystems. For example, speaker 1040 could be connected to the other subsystems through a port or have an internal direct connection to central processor 1010. The processor may include multiple processors or a multicore processor, which may permit parallel processing of information. Computer system 1005 is only one example of a computer system suitable for use with the present system. Other configurations of subsystems suitable for use with the present invention will be readily apparent to one of ordinary skill in the art.

Computer software products may be written in any of various suitable programming languages. The computer software product may be an independent application with data input and data display modules. Alternatively, the computer software products may be classes that may be instantiated as distributed objects. The computer software products may also be component software.

An operating system for the system 1005 may be one of the Microsoft Windows family of systems, Linux, Mac OS X, IRIX32, or IRIX64. Other operating systems may be used. Microsoft Windows is a trademark of Microsoft Corporation, and Mac is a trademark of Apple Corporation.

The computer may be connected to a network and may interface to other computers using this network. The network may be an intranet, internet, or the Internet, among others. The network may be a wired network (e.g., using copper), telephone network, packet network, an optical network (e.g., using optical fiber), or a wireless network, or any combination of these. For example, data and other information may be passed between the computer and components (or steps) of a system of the invention using a wireless network using a protocol such as Wi-Fi (IEEE standards 802.11x), near field communication (NFC), radio-frequency identification (RFID), mobile or cellular wireless. For example, signals from a computer may be transferred, at least in part, wirelessly to components or other computers.

In an embodiment, with a web browser executing on a computer workstation system, a user accesses a system on the World Wide Web (WWW) through a network such as the Internet. The web browser is used to download web pages or other content in various formats including HTML, XML, text, PDF, and postscript, and may be used to upload information to other parts of the system. The web browser may use uniform resource identifiers (URLs) to identify resources on the web and hypertext transfer protocol (HTTP) in transferring files on the web.

For the sake of clarity, the processes and methods herein have been illustrated with a specific flow, but it should be understood that other sequences may be possible and that some may be performed in parallel, without departing from the spirit of the invention. Additionally, steps may be subdivided or combined. As disclosed herein, software written in accordance with the present invention may be stored in some form of computer-readable medium, such as memory or CD-ROM, or transmitted over a network, and executed by a processor. More than one computer may be used, such as by using multiple computers in a parallel or load-sharing arrangement or distributing tasks across multiple computers such that, as a whole, they perform the functions of the components identified herein; i.e., they take the place of a single computer. Various functions described above may be performed by a single process or groups of processes, on a single computer or distributed over several computers. Processes may invoke other processes to handle certain tasks. A single storage device may be used, or several may be used to take the place of a single storage device.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

All references cited herein are intended to be incorporated by reference. While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A computer-implemented method of optimizing compression for reads in a restore path of a client-side inline deduplication file system, comprising:
   first tracking file system server CPU usage for a defined period of time;
   first predicting future server CPU usage based on the tracked usage;
   first comparing the prediction to a first defined threshold;
   second tracking, if the predicted future server CPU usage is below the first threshold, client CPU usage for the defined period of time;
   second predicting future client CPU usage based on the second tracked usage;
   second comparing the prediction to a second threshold; and
   applying compression to data read by the server for transmission to the client if the predicted future server and client CPU usage both exceed their respective first and second thresholds, otherwise sending the data from the server to the client as non-compressed data.

2. The method of claim 1 wherein the read operation comprises a restore operation performed by the deduplication backup system executed by a data storage server running a Data Domain File System (DDFS), and wherein the predicted server CPU usage indicates whether or not the server CPU has sufficient resources to perform the compression, and the predicted client CPU usage indicates whether or not the client CPU has sufficient resources to decompress the compressed data sent from the server, both without causing system instability.

3. The method of claim 1 further comprising deploying a Data Domain (DD) Boost file system (FS) interface (API) to access a DDBOOST library on the client hosting one or more applications generating the backup data and to perform segmentation and the reference calculating steps of a deduplication process of the DDFS, wherein the DDBOOST library is extended to the server to allow the server to access one or more functions of the DDFS, and further wherein the DDBOOST FS API presents a standard file system mount point to an application residing on the client, and wherein the application issues a read request to access a buffer in backup storage on the server.

4. The method of claim 3 wherein the compression comprises a built-in lossless compression mechanism of the DDBOOST FS, and further comprises at least one of: Lempel-Ziv (LZ), Gzip (GZ) or Huffman encoding.

5. The method of claim 1 wherein the first predicting and second predicting use one of a statistical method or an artificial intelligence/machine learning (AI/ML) method, and wherein the statistical method comprises one of a moving averages or weighted moving averages process, and wherein the AI/ML method comprises one of a piecewise linear regression-based prediction method or a time-series analysis method.

6. The method of claim 1 further comprising encoding the predicted client CPU usage as metadata appended to the read request for the second comparing.

7. The method of claim 6 wherein the CPU usage comprises a percentage amount of time that the CPU is performing non-idle work, and wherein the defined period of time is divided into a plurality of epochs, each comprising on the order of one second.

8. The method of claim 1 further comprising comparing a size of the compressed data with a size of the non-compressed data, and not applying the compression if the compared size is not smaller for the compressed data in excess of a defined compressed size amount.

9. A computer-implemented method of improving read performance through adaptive compression in a deduplication file system of a data protection network, comprising:
   sending a read request from an application in a client to a server over the network to access backup data stored in a storage target;
   first tracking client CPU usage of performing non-idle work for past and present time periods;
   first predicting a client CPU usage for one or more future time periods based on the first tracking;
   encoding the predicted client CPU usage in the read request sent to the server; and
   using the predicted client CPU usage with a predicted server CPU usage to determine whether or not data read from the storage target in response to the read request should be transmitted to the client as compressed data or non-compressed data.

10. The method of claim 9 further comprising:
    second tracking server CPU usage of performing non-idle work for the past and present time periods;
    second predicting a server CPU usage for the one or more future time periods based on the second tracking;
    comparing the predicted server CPU usage and the predicted client CPU usage to respective threshold values; and
    applying, if both the predicted server CPU usage and predicted client CPU usage are below a defined maximum usage threshold, a compression process to the data read from the storage target to generate the compressed data.

11. The method of claim 10 wherein the predicted server CPU usage indicates whether or not the server CPU has sufficient resources to perform the compression operation, and the predicted client CPU usage indicates whether or not the client CPU has sufficient resources to decompress the compressed data sent from the server, both without causing system instability.

12. The method of claim 10 further comprising comparing a size of the compressed data with a size of the non-compressed data, and not applying the compression if the compared size is not smaller for the compressed data in excess of a defined compressed size amount.

13. The method of claim 10 wherein the first predicting and second predicting use one of a statistical method or an artificial intelligence/machine learning (AI/ML) method, and wherein the statistical method comprises one of a moving averages or weighted moving averages process, and wherein the AI/ML method comprises one of a piecewise linear regression-based prediction method or a time-series analysis method.

14. The method of claim 10 wherein the read operation comprises a restore operation performed by the deduplication file system comprising a Data Domain File System (DDFS), the method further comprising deploying a Data Domain (DD) Boost file system (FS) interface (API) to access a DDBOOST library on the client hosting one or more applications generating the backup data and to perform segmentation and the reference calculating steps of a deduplication process of the DDFS, wherein the DDBOOST library is extended to the server to allow the server to access one or more functions of the DDFS, and yet further wherein the DDBOOST FS API presents a standard file system mount point to an application residing on the client, and wherein the application issues a read request to access a buffer in backup storage on the server.

15. The method of claim 14 wherein the compression comprises a built-in lossless compression mechanism of the DDBOOST FS, and further comprises at least one of: Lempel-Ziv (LZ), Gzip (GZ) or Huffman encoding.

16. An apparatus for improving read performance through adaptive compression in a deduplication file system of a data protection network having a client coupled to a server, comprising:

an application of the client sending a read request from the client to the server over the network to access backup data stored in a storage target maintained by the server;

an adaptive compression component first tracking client CPU usage of performing non-idle work for past and present time periods, first predicting a client CPU usage for one or more future time periods based on the first tracking;

a client component encoding the predicted client CPU usage in the read request sent to the server;

a server component second tracking server CPU usage of performing non-idle work for the past and present time periods, and second predicting a server CPU usage for the one or more future time periods based on the second tracking;

a comparator of the adaptive compression component comparing the predicted server CPU usage and the predicted client CPU usage to respective threshold values, and applying, if both the predicted server CPU usage and predicted client CPU usage are below a defined maximum usage threshold, a compression process to the data read from the storage target to generate the compressed data.

17. The apparatus of claim 16 wherein the predicted server CPU usage indicates whether or not the server CPU has sufficient resources to perform the compression operation, and the predicted client CPU usage indicates whether or not the client CPU has sufficient resources to decompress the compressed data sent from the server, both without causing system instability, the adaptive compression component further comparing a size of the compressed data with a size of the non-compressed data, and not applying the compression if the compared size is not smaller for the compressed data in excess of a defined compressed size amount.

18. The apparatus of claim 16 wherein the first predicting and second predicting use one of a statistical method or an artificial intelligence/machine learning (AI/ML) method, and wherein the statistical method comprises one of a moving averages or weighted moving averages process, and wherein the AI/ML method comprises one of a piecewise linear regression-based prediction method or a time-series analysis method, wherein the compression comprises a built-in lossless compression mechanism deduplication file system, and further comprises at least one of: Lempel-Ziv (LZ), Gzip (GZ) or Huffman encoding.

19. The apparatus of claim 18 wherein the read operation comprises a restore operation performed by the deduplication file system comprising a Data Domain File System (DDFS), and further comprising Data Domain (DD) Boost file system (FS) interface (API) to access a DDBOOST library on the client hosting one or more applications generating the backup data and to perform segmentation and the reference calculating steps of a deduplication process of the DDFS, wherein the DDBOOST library is extended to the server to allow the server to access one or more functions of the DDFS, and yet further wherein the DDBOOST FS API presents a standard file system mount point to an application residing on the client, and wherein the application issues a read request to access a buffer in backup storage on the server.

20. The apparatus of claim 16 further comprising a post-processing component comparing a size of the compressed data with a size of the non-compressed data, and not applying the compression if the compared size is not smaller for the compressed data in excess of a defined compressed size amount.

* * * * *